United States Patent [19]

Covert et al.

[11] Patent Number: 4,732,588
[45] Date of Patent: Mar. 22, 1988

[54] CANISTER USING THERMOELECTRIC COOLER

[75] Inventors: Charles H. Covert, Manchester; William E. Gifford, Hemlock; Edwin C. Storey, Rochester, all of N.Y.

[73] Assignee: General Motors Corporation, Detroit, Mich.

[21] Appl. No.: 49,405

[22] Filed: May 14, 1987

[51] Int. Cl.⁴ .................. B01D 29/38; B01D 53/04
[52] U.S. Cl. ................................. 55/196; 55/201; 55/208; 123/519
[58] Field of Search .............. 55/196, 200, 201, 202, 55/208; 123/519

[56] References Cited

U.S. PATENT DOCUMENTS

| | | | |
|---|---|---|---|
| 1,695,358 | 12/1928 | Appleman . | |
| 2,278,192 | 3/1942 | Cantacuzene . | |
| 2,472,622 | 6/1949 | Savard . | |
| 2,801,706 | 8/1957 | Asker | 55/196 X |
| 3,432,995 | 3/1969 | Jaeger et al. | 55/208 X |
| 3,734,293 | 5/1973 | Biskis | 55/208 X |
| 3,850,592 | 11/1974 | Huffman | 55/208 X |
| 4,403,587 | 9/1983 | Mizuno et al. | 123/519 |
| 4,598,686 | 7/1986 | Lupoli et al. | 55/208 X |

FOREIGN PATENT DOCUMENTS 822242 11/1951 Fed. Rep. of Germany ........ 55/196

Primary Examiner—Kathleen J. Prunner
Attorney, Agent, or Firm—C. K. Veenstra

[57] ABSTRACT

A fuel vapor storage canister includes a vapor inlet for introducing vapor into the canister and a bed of adsorbant material in fluid communication with the inlet for adsorbing vapor within the canister. A vapor purge tube is in fluid communication with the bed for purging fuel vapor from the bed. A thermoelectric cooler/heater selectively cools the inlet tube to promote condensation of vapors therein and selectively and alternatively heats the bed to promote purging of vapors from the bed and the remainder of the canister.

3 Claims, 2 Drawing Figures

CANISTER USING THERMOELECTRIC COOLER

TECHNICAL FIELD

This invention relates to control of fuel vapor released from a fuel tank. More particularly, this invention collects fuel vapor released from a fuel tank, condenses and stores the vapor, and purges the collected fuel to the engine when it is running.

BACKGROUND ART

The interior temperature of a fuel tank, such as an automobile fuel tank, rises and falls during the use of the vehicle. Vapor can be vented from the fuel tank and into a fuel vapor canister.

The U.S. Pat. No. 1,695,358 to Appleman, issued Dec. 18, 1928, is an example of a tank for storing a volatile liquid such as oil, which includes a vent and overflow opening adjacent its upper end for venting vapor. The Appleman patent provides no means for adsorbing the vapors.

The U.S. Pat. Nos. 2,278,192 to Cantacuzene, issued Mar. 31, 1942 and 2,472,622 to Savard, issued June 7, 1949, disclose thermic processes and assemblies for recovering fuel vapor.

Copending U.S. Ser. No. 918,886, filed Oct. 15, 1986, which is a continuation-in-part of patent application Ser. No. 851,548, filed Apr. 14, 1986, and assigned to the assignee of the present invention discloses a fuel vapor storage canister which avoids releasing the fuel vapor to the atmosphere. The application discloses a system which vents the vapor to a canister having a bed that adsorbs and stores the fuel vapor. Specifically, the adsorptive material is an activated carbon.

It is an object of the present invention to increase the efficiency of storage of vapors by the canister.

It is another objective of the invention to increase the efficiency of the purging of fuel from the canister.

SUMMARY OF THE INVENTION

In carrying out the aforementioned objectives, the present invention provides a fuel storage canister including vapor inlet means for introducing vapor into the canister, adsorbing means for adsorbing vapor within the canister, vapor purge means in fluid communication with the adsorbing means for purging fuel vapor from the adsorbing means, and heat exchange means for selectively cooling the inlet means and alternatively heating the adsorbing means.

More specifically, the fuel vapor storage canister includes an inlet chamber, a region vented to atmosphere, adsorbing means in fluid communication with the chamber and the region for adsorbing fuel vapor between the fuel chamber and the region, the adsorbing means releasing vapor more efficiently when heated. Fuel vapor inlet means extends through the adsorbing means and into the chamber for introducing vapor into the chamber. Vapor purge means opens to the chamber for causing air to flow from the region and through the adsorbing means to purge the fuel vapor from the adsorbing means. A thermoelectric cooler/heater is in proximity of the inlet means and the adsorbing means for selectively cooling the inlet means to promote condensation of vapors and for selectively and alternatively heating the adsorbing means for promoting purging of vapors from the adsorbing means.

FIGURES IN THE DRAWINGS

Other advantages of the present invention will be readily appreciated as the same becomes completely understood by reference to the following detailed description when considered in connection with the accompanying drawings wherein:

FIG. 1 is a schematic representation of the environment of the present invention; and FIG. 2 is an elevational cross-sectional view of a fuel storage canister constructed in accordance with the present invention.

DETAILED DESCRIPTION OF THE DRAWINGS

Figure 1:
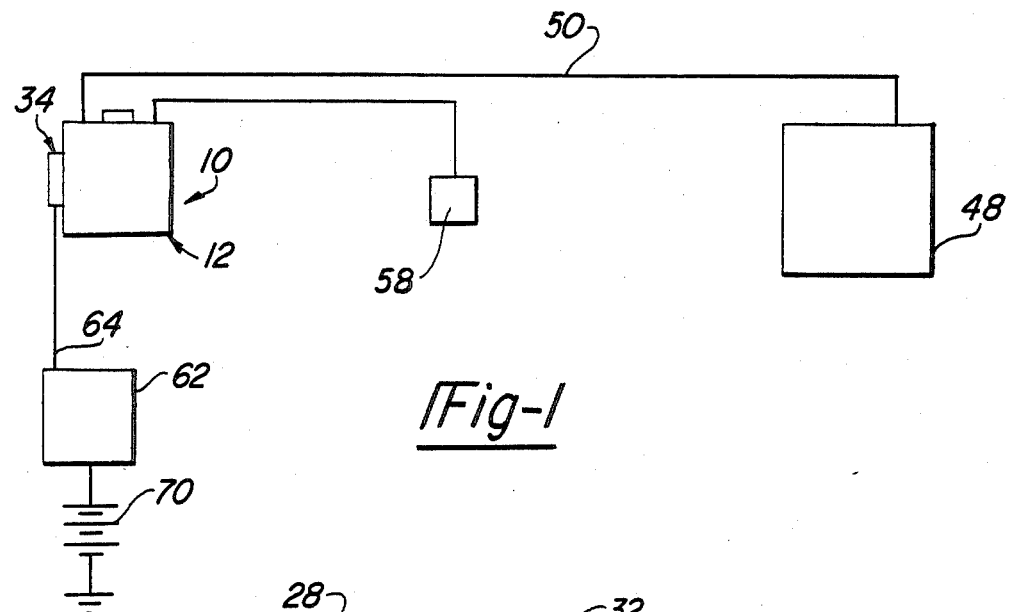

A fuel storage canister constructed in accordance with the present invention is generally shown at 10 in the Figures.

The canister 10 includes a housing 12 mounted to a support wall 14 of a vehicle by a mounting plate 16. Fasteners, such as screws 18, can be utilized to secure the bracket 16 to the wall 14.

The housing 12 contains a bed 20 supported by a lower foam screen 22 and contained on top and on the sides by the walls of the housing 12. The bed 20 comprises activated carbon adapted to adsorb fuel vapor. The adsorbant ability of the carbon is temperature dependent. The activated carbon adsorbs vapor more efficiently when cooled and less efficiently when heated.

A fuel vapor inlet chamber 24 is contained within the housing 12 below the screen 22. The chamber 24 provides a trap to capture any liquid fuel within the housing 12. By capturing the liquid fuel before it reaches the bed 20, the chamber 24 protects the bed 20 from absorption of liquid fuel. The activated charcoal is thereby preserved for adsorption of the fuel vapor.

A curved fuel vapor inlet tube 26 is supported by the top wall 28 of the housing 12 and extends through the bed 20. The inlet tube 26 opens to the inlet chamber 24 below the bed 20 and screen 22.

A purge tube 30 is supported by the top 28 and extends through the bed 20 to open into the inlet chamber 24 below the bed 20 and screen 22. The purge tube 30 includes a small liquid inlet opening 54 and a relatively larger vapor inlet opening 56 disposed above the liquid inlet opening 54.

The upper region of the housing 12 is open to the atmosphere through an air vent 32.

The canister 10 includes heat exchange means generally indicated at 34 for selectively cooling the inlet tube 26 to promote condensation of vapors therein and for selectively and alternatively heating the bed 20 for promoting purging of vapors from the activated charcoal and the remainder of the canister 10. More specifically, the heat exchange means includes a thermoelectric cooler/heater 36 mounted within an opening 38 in the housing 12. The thermoelectric cooler/heater 36 includes a heat exchange element 40 extending into the bed 20. The inlet tube 26 is curved so as to include portions 42 and 44 adjacent the heat exchange element 40. The remainder of the element 40 is exposed to the bed 20. The heat exchange element can be actuated to selectively cool the inlet tube 26 and selectively and alternatively heat the bed 20. The opposite side 46 of the thermoelectric cooler/heater is connected to the mounting bracket 16. The mounting bracket 16 thereby provides a heat sink for the thermoelectric cooler/heater.

An example of a thermoelectric cooler/heater for use with the present invention is part No. CP1.4-127-10L manufactured by Melcor Company, Trenton, N.J.

Figure 2:
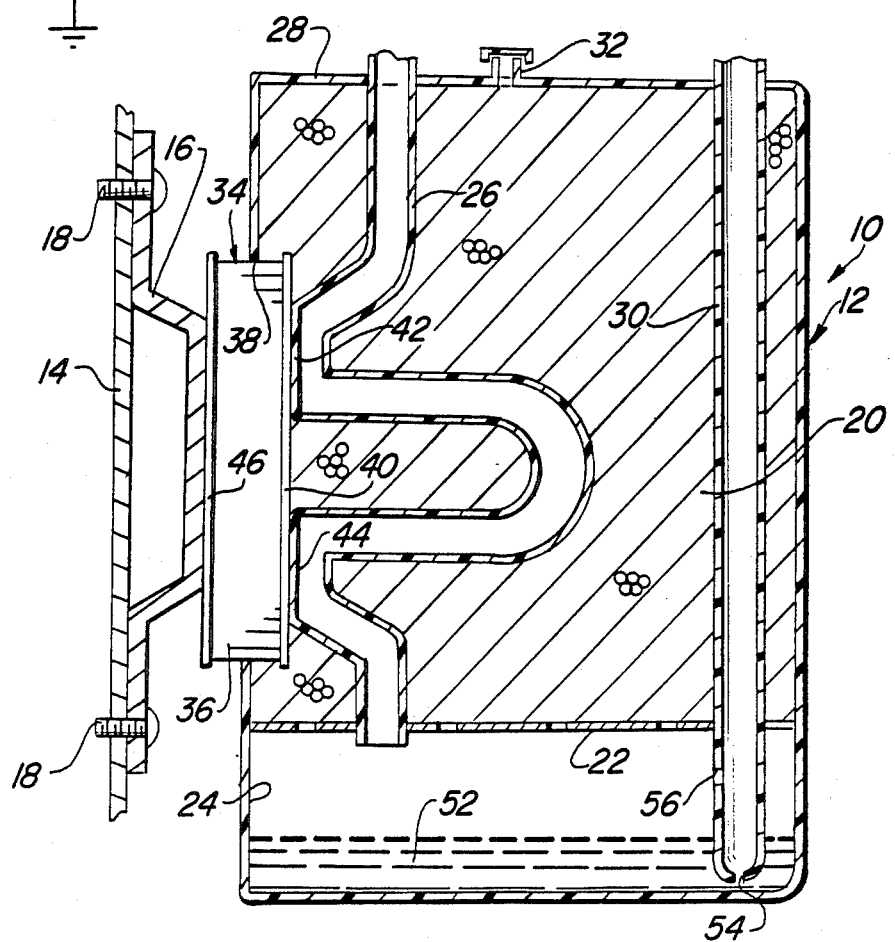

In operation, and referring to FIGS. 1 and 2, the inlet tube 26 receives a mixture of fuel, vapor and air discharged from the fuel tank 48 through line 50. The inlet tube 26 provides a vapor inlet means for introducing vapor into the chamber 24. As it is desirable at this stage to collect condensed fuel to be returned to the engine, the thermoelectric cooler/heater is actuated to cool the inlet tube 26 thereby promoting condensation of vapors within the tube. The condensed fuel 52 is collected at the bottom of the chamber 24. As the remaining mixture of air and fuel vapor passes into the chamber 24 and rises through the bed 20, the activated carbon in the bed 20 adsorbs the fuel vapor and the air flows out through the vent 32. The chamber 24 provides a trap to capture any liquid fuel 52 that may be present in the mixture of the fuel vapor and air received through the inlet tube 26 and also collects the fuel condensed while passing through the cooled inlet tube 26.

The purge tube 30 provides vapor purge means in fluid communication with the adsorbing activated carbon bed 20 for purging fuel vapor from the bed 20 and liquid fuel from the chamber 24.

To purge the canister of fuel vapor and liquid, the engine intake system 58 applies a vacuum to the purge tube 30. The vacuum applied through the vapor purge hole 56 draws air in through the canister vent 32, down through the bed 20, and into the chamber 24. The air flow through the bed 20 desorbs the fuel vapor, and the resulting mixture of air and fuel vapor is drawn out through the purge tube 30. The vapor is returned to the intake of the engine. The thermoelectric cooler/heater heats the adsorbing bed of activated carbon 20 and thereby promotes the purging of vapors from the carbon since the activated carbon bed releases the fuel vapors more efficiently when heated. The resulting mixture of air and fuel vapor is drawn out through the purge tube 30. The vacuum applied through the liquid purge hole 54 gradually purges the liquid fuel from the chamber 24. The liquid fuel is drawn out through the purge tube 30 along with the mixture of air and fuel vapor.

As shown in FIG. 1, a control and information integrating source 62 communicates with the thermoelectric cooler/heater 34 through line 64. The control can be an onboard computer receiving and integrating information from the system. For example, the computer can sense when the engine is running. When the engine is running, the carbon bed 20 is heated during purging. When the engine is turned off, the tube 26 is cooled to aid condensation. The thermoelectric cooler 36 can be driven by the battery 70, a typical thermoelectric cooler requiring 3 amps from a 12 volt battery.

Although other forms of heat exchange means can be contemplated and used in accordance with the present invention, the thermoelectric cooler provides several advantages. Thermoelectric coolers can be manufactured in a small size and are relatively inexpensive. The thermoelectric cooler can provide sufficient energy to either heat the bed 20 or cool the inlet pipe 26 while not requiring large amounts of energy to be drawn from the battery 70. Since the thermoelectric cooler requires little energy, the system can be operated after the vehicle engine is turned off. The thermoelectric cooler is electrically driven, therefore it can be controlled simply and accurately. In comparison with a compressor system within the assembly, a compressor system would require large amounts of energy and would be shut down when the vehicle engine is turned off. Additionally, the thermoelectric cooler has the advantage of no moving parts. By having no moving parts, there is no deterioration of the component and the component runs silently.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims the invention may be practiced otherwise than as specifically described.

What is claimed is:

1. In a fuel vapor storage canister of the type including: vapor inlet means for introducing vapor into said canister; adsorbing means in fluid communication with said inlet means for adsorbing vapor within said canister, said adsorbing means being temperature dependent by adsorbing vapor more efficiently when cooled and releasing vapor more efficiently when heated; vapor purge means in fluid communication with said adsorbing means for purging fuel vapor from said adsorbing means, the improvement comprising heat exchange means for selectively cooling said inlet means to promote condensation of vapors therein and for selectively and alternatively heating said adsorbing means for promoting purging of vapors from said adsorbing means.

2. In a fuel vapor storage canister including: an inlet chamber; a region vented to atmosphere; adsorbing means being in fluid communication with said chamber and said region for adsorbing fuel vapor between said chamber and said region, said adsorbing means adsorbing vapor more efficiently when cooled and releasing vapor more efficiently when heated; fuel vapor inlet means extending through said adsorbing means and into said chamber for introducing vapor into said chamber; vapor purge means opening to said chamber for causing air to flow from said region and through said adsorbing means to purge fuel vapor and liquid from said adsorbing means and chamber; the improvement comprising a thermoelectric cooler/heater in proximity of said inlet means and said adsorbing means for selectively cooling said inlet means to promote condensation of vapors therein and for selectively and alternatively heating said adsorbing means for promoting purging of vapors from said adsorbing means.

3. In a fuel vapor storage canister including: a housing; an inlet chamber; a region vented to atmosphere; a bed of material for adsorbing fuel vapor between said chamber and said region; a fuel vapor inlet tube extending through said bed and into said chamber; a purge tube opening into said chamber; the improvement comprising a thermoelectric cooler/heater mounted through said housing and having a heat exchange element extending into said bed, said inlet tube being curved and including portions adjacent said heat exchange element whereby said element selectively cools said inlet tube and selectively and alternatively heats said bed.

* * * * *